(12) United States Patent
Kayes et al.

(10) Patent No.: US 10,615,304 B2
(45) Date of Patent: Apr. 7, 2020

(54) OPTOELECTRONIC DEVICE WITH DIELECTRIC LAYER AND METHOD OF MANUFACTURE

(71) Applicant: Alta Devices, Inc., Sunnyvale, CA (US)

(72) Inventors: Brendan M. Kayes, Los Gatos, CA (US); Melissa J. Archer, San Jose, CA (US); Thomas J. Gmitter, Sunnyvale, CA (US); Gang He, Cupertino, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 113 days.

(21) Appl. No.: 15/837,533

(22) Filed: Dec. 11, 2017

(65) Prior Publication Data

US 2018/0102443 A1 Apr. 12, 2018

Related U.S. Application Data

(60) Division of application No. 14/846,675, filed on Sep. 4, 2015, and a continuation-in-part of application No.
(Continued)

(51) Int. Cl.
*H01L 31/18* (2006.01)
*H01L 31/0232* (2014.01)
(Continued)

(52) U.S. Cl.
CPC .... *H01L 31/1892* (2013.01); *H01L 31/02167* (2013.01); *H01L 31/02327* (2013.01);
(Continued)

(58) Field of Classification Search
CPC ... H01L 31/18; H01L 31/184; H01L 31/1852; H01L 31/1892
See application file for complete search history.

(56) References Cited

U.S. PATENT DOCUMENTS 3,615,853 A 10/1971 Paine et al.
3,838,359 A 9/1974 Hakki et al.
(Continued)

FOREIGN PATENT DOCUMENTS

CN 1574388 A 2/2005
CN 102007582 A 4/2011
(Continued)

OTHER PUBLICATIONS

**Advisory Action dated Apr. 13, 2016 for U.S. Appl. No. 13/446,876 of Kayes, B.M. et al. filed Apr. 13, 2012.
(Continued)

*Primary Examiner* — Lindsey A Bernier
(74) *Attorney, Agent, or Firm* — Arent Fox LLP

(57) ABSTRACT

An optoelectronic device and a method for fabricating the optoelectronic device are disclosed. The optoelectronic device comprises a p-n structure, a patterned dielectric layer comprising a dielectric material and a metal layer disposed on the dielectric layer. The metal layer makes one or more contact to the p-n structure through the patterned dielectric layer. The dielectric material may be chemically resistant to acids and may provide adhesion to the p-n structure and the metal layer. The method for fabricating an optoelectronic device comprises providing a p-n structure, providing a dielectric layer on the p-n structure and providing a metal layer on the dielectric layer and then lifting the device off the substrate, such that after the lift off the p-n structure is closer than the patterned dielectric layer to a front side of the device; wherein the device comprises the p-n structure, the patterned dielectric layer, and the metal layer.

17 Claims, 7 Drawing Sheets

Related U.S. Application Data

12/904,047, filed on Oct. 13, 2010, now Pat. No. 9,691,921, and a continuation-in-part of application No. 13/446,876, filed on Apr. 13, 2012, and a continuation-in-part of application No. 13/354,175, filed on Jan. 19, 2012, now Pat. No. 9,136,422, and a continuation-in-part of application No. 14/452,393, filed on Aug. 5, 2014, now Pat. No. 9,502,594.

(51) Int. Cl.
  *H01L 31/0236* (2006.01)
  *H01L 31/0216* (2014.01)
  *H01L 31/0352* (2006.01)
  *H01L 33/22* (2010.01)
  *H01L 31/0693* (2012.01)
  *H01L 33/40* (2010.01)

(52) U.S. Cl.
  CPC ........... *H01L 31/02363* (2013.01); *H01L 31/035281* (2013.01); *H01L 31/0693* (2013.01); *H01L 31/18* (2013.01); *H01L 31/184* (2013.01); *H01L 31/1852* (2013.01); *H01L 33/22* (2013.01); *H01L 33/405* (2013.01); *Y02E 10/544* (2013.01)

(56) References Cited

U.S. PATENT DOCUMENTS

| | | |
|---|---|---|
| 3,990,101 A | 11/1976 | Ettenberg et al. |
| 4,015,280 A | 3/1977 | Matsushita et al. |
| 4,017,332 A | 4/1977 | James |
| 4,094,704 A | 6/1978 | Milnes et al. |
| 4,107,723 A | 8/1978 | Kamath |
| 4,191,593 A | 3/1980 | Cacheux |
| 4,197,141 A | 4/1980 | Bozler et al. |
| 4,295,002 A | 10/1981 | Chappell et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj |
| 4,444,992 A | 4/1984 | Cox, III |
| 4,479,027 A | 10/1984 | Todorof |
| 4,497,974 A | 2/1985 | Deckman et al. |
| 4,543,441 A | 9/1985 | Kumada |
| 4,571,448 A | 2/1986 | Barnett |
| 4,582,952 A | 4/1986 | McNeely et al. |
| 4,633,030 A | 12/1986 | Cook |
| 4,667,059 A | 5/1987 | Olson |
| 4,773,945 A | 9/1988 | Woolf |
| 4,775,639 A | 10/1988 | Yoshida |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,101,260 A | 3/1992 | Nath |
| 5,103,268 A | 4/1992 | Yin et al. |
| 5,116,427 A | 5/1992 | Fan et al. |
| 5,136,351 A | 8/1992 | Inoue et al. |
| 5,217,539 A | 6/1993 | Fraas et al. |
| 5,223,043 A | 6/1993 | Olson et al. |
| 5,230,746 A | 7/1993 | Wiedeman et al. |
| 5,231,931 A | 8/1993 | Sauvageot et al. |
| 5,316,593 A | 5/1994 | Olson et al. |
| 5,330,585 A | 7/1994 | Chang et al. |
| 5,342,453 A | 8/1994 | Olson |
| 5,356,488 A | 10/1994 | Hezel |
| 5,376,185 A | 12/1994 | Wanlass |
| 5,385,960 A | 1/1995 | Emmons et al. |
| 5,405,453 A | 4/1995 | Ho et al. |
| 5,465,009 A | 11/1995 | Drabik et al. |
| 5,468,652 A | 11/1995 | Gee |
| 6,107,563 A | 8/2000 | Nakanishi et al. |
| 6,166,218 A | 12/2000 | Ravichandran et al. |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,281,426 B1 | 8/2001 | Olson et al. |
| 6,372,981 B1 | 4/2002 | Ueda et al. |
| 6,452,091 B1 | 9/2002 | Nakagawa |
| 6,534,336 B1 | 3/2003 | Iwane et al. |
| 6,617,508 B2 | 9/2003 | Kilmer et al. |
| 7,038,250 B2 | 5/2006 | Sugiyama et al. |
| 7,875,945 B2 | 1/2011 | Krasnov et al. |
| 8,183,081 B2 | 5/2012 | Weidman et al. |
| 8,258,596 B2 | 9/2012 | Nasuno et al. |
| 8,664,515 B2 | 3/2014 | Hong et al. |
| 8,697,553 B2 | 4/2014 | Adibi et al. |
| 8,895,845 B2 | 11/2014 | Kizilyalli et al. |
| 8,895,846 B2 | 11/2014 | Kizilyalli et al. |
| 8,937,244 B2 | 1/2015 | Kizilyalli et al. |
| 8,993,873 B2 | 3/2015 | Youtsey et al. |
| 9,099,595 B2 | 8/2015 | King et al. |
| 9,136,418 B2 | 9/2015 | Nie et al. |
| 9,136,422 B1 | 9/2015 | Higashi et al. |
| 9,178,099 B2 | 11/2015 | Nie et al. |
| 9,502,594 B2 | 11/2016 | Ding et al. |
| 9,537,025 B1 | 1/2017 | Higashi et al. |
| 9,691,921 B2 | 6/2017 | Atwater et al. |
| 9,768,329 B1 | 9/2017 | Kayes et al. |
| 2001/0027805 A1 | 10/2001 | Ho et al. |
| 2002/0000244 A1 | 1/2002 | Zaidi |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0070707 A1 | 4/2003 | King et al. |
| 2003/0140962 A1 | 7/2003 | Sharps et al. |
| 2003/0222278 A1 | 12/2003 | Liu et al. |
| 2004/0112426 A1 | 6/2004 | Hagino |
| 2004/0166681 A1 | 8/2004 | Iles et al. |
| 2004/0200523 A1 | 10/2004 | King et al. |
| 2005/0001233 A1 | 1/2005 | Sugiyama et al. |
| 2005/0022863 A1 | 2/2005 | Agostinelli et al. |
| 2006/0021565 A1* | 2/2006 | Zahler ............ C30B 23/02 117/89 |
| 2006/0081963 A1 | 4/2006 | Rehder et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0207651 A1 | 9/2006 | Posthuma et al. |
| 2006/0255340 A1 | 11/2006 | Manivannan et al. |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0151596 A1 | 7/2007 | Nasuno et al. |
| 2007/0166862 A1 | 7/2007 | Kim et al. |
| 2007/0199591 A1 | 8/2007 | Harder |
| 2007/0235074 A1 | 10/2007 | Henley et al. |
| 2007/0277874 A1 | 12/2007 | Dawson-Elli et al. |
| 2008/0128020 A1 | 6/2008 | Zafar et al. |
| 2008/0245409 A1 | 10/2008 | Varghese et al. |
| 2009/0151784 A1 | 6/2009 | Luan et al. |
| 2009/0283802 A1 | 11/2009 | Henderson et al. |
| 2009/0288703 A1 | 11/2009 | Stan et al. |
| 2010/0006143 A1 | 1/2010 | Welser |
| 2010/0015751 A1 | 1/2010 | Weidman et al. |
| 2010/0047959 A1 | 2/2010 | Cornfeld et al. |
| 2010/0055397 A1 | 3/2010 | Kurihara et al. |
| 2010/0065117 A1 | 3/2010 | Kim et al. |
| 2010/0089443 A1 | 4/2010 | Bloomstein et al. |
| 2010/0096010 A1 | 4/2010 | Welser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132774 A1 | 6/2010 | Borden |
| 2010/0132780 A1 | 6/2010 | Kizilyalli et al. |
| 2010/0193002 A1 | 8/2010 | Dimroth et al. |
| 2010/0218819 A1 | 9/2010 | Farmer et al. |
| 2010/0270653 A1 | 10/2010 | Leitz et al. |
| 2010/0294349 A1 | 11/2010 | Srinivasan |

(56) References Cited

U.S. PATENT DOCUMENTS

| | | | |
|---|---|---|---|
| 2010/0294356 | A1 | 11/2010 | Parikh et al. |
| 2011/0083722 | A1 | 4/2011 | Atwater et al. |
| 2011/0088771 | A1 | 4/2011 | Lin et al. |
| 2011/0108098 | A1 | 5/2011 | Kapur |
| 2011/0156000 | A1 | 6/2011 | Cheng |
| 2011/0186115 | A1 | 8/2011 | Wanlass et al. |
| 2011/0189817 | A1 | 8/2011 | Takahashi et al. |
| 2011/0214728 | A1 | 9/2011 | Veerasamy |
| 2011/0244692 | A1 | 10/2011 | Jeong et al. |
| 2011/0290322 | A1 | 12/2011 | Meguro et al. |
| 2012/0024336 | A1 | 2/2012 | Hwang |
| 2012/0031478 | A1 | 2/2012 | Boisvert et al. |
| 2012/0055541 | A1 | 3/2012 | Granek |
| 2012/0067423 | A1 | 3/2012 | Lochtefeld |
| 2012/0104411 | A1 | 5/2012 | Iza et al. |
| 2012/0125256 | A1 | 5/2012 | Kramer et al. |
| 2012/0132930 | A1 | 5/2012 | Young et al. |
| 2012/0160296 | A1 | 6/2012 | Laparra et al. |
| 2012/0164796 | A1 | 6/2012 | Lowenthal et al. |
| 2012/0227805 | A1 | 9/2012 | Hermle et al. |
| 2012/0247555 | A1 | 10/2012 | Matsushita et al. |
| 2012/0305059 | A1 | 12/2012 | Kayes |
| 2013/0025654 | A1 | 1/2013 | Bedell et al. |
| 2013/0026481 | A1 | 1/2013 | Xu et al. |
| 2013/0112258 | A1 | 5/2013 | Park et al. |
| 2013/0153013 | A1 | 6/2013 | Archer et al. |
| 2013/0220396 | A1 | 8/2013 | Janssen et al. |
| 2013/0270589 | A1 | 10/2013 | Kayes |
| 2013/0288418 | A1 | 10/2013 | Wang et al. |
| 2013/0337601 | A1 | 12/2013 | Kapur |
| 2014/0076386 | A1 | 3/2014 | King et al. |
| 2014/0261611 | A1 | 9/2014 | King et al. |
| 2014/0312373 | A1 | 10/2014 | Donofrio |
| 2015/0171261 | A1 | 6/2015 | Domine |
| 2015/0228835 | A1 | 8/2015 | Kayes et al. |
| 2015/0368833 | A1 | 12/2015 | Farah |
| 2015/0380576 | A1 | 12/2015 | Kayes et al. |
| 2016/0155881 | A1 | 6/2016 | France et al. |
| 2017/0047471 | A1 | 2/2017 | Ding et al. |
| 2017/0141256 | A1 | 5/2017 | Kayes et al. |
| 2017/0148930 | A1 | 5/2017 | Hu et al. |

FOREIGN PATENT DOCUMENTS

| | | |
|---|---|---|
| CN | 102473743 A | 5/2012 |
| CN | 103952768 A | 7/2014 |
| EP | 0595634 A1 | 5/1994 |
| EP | 2927968 A1 | 10/2015 |
| GB | 2501432 A | 10/2013 |
| JP | 63211775 A | 9/1988 |
| JP | 03285368 A | 12/1991 |
| JP | 06244443 A | 9/1994 |
| JP | 07007148 B2 | 1/1995 |
| JP | 08130321 A | 5/1996 |
| JP | H-09-213206 A | 8/1997 |
| KR | 100762772 B1 | 10/2007 |
| WO | 02065553 A1 | 8/2002 |
| WO | 2008100603 A1 | 8/2008 |
| WO | 2016/123074 A1 | 8/2016 |

OTHER PUBLICATIONS

\*\*Advisory Action dated Jul. 22, 2011, for U.S. Appl. No. 12/605,108 of Kizilyalli, I.C. et al. dated Nov. 23, 2009.
\*\*Corrected Notice of Allowability dated Dec. 9, 2015 for U.S. Appl. No. 14/452,393 of Ding, I.-K. et al. filed Aug. 5, 2014.
\*\*Corrected Notice of Allowability dated Jun. 26, 2017 for U.S. Appl. No. 13/705,064 of Kayes, B.M. et al. filed Dec. 4, 2012.
\*\*Corrected Notice of Allowability dated May 26, 2017, for U.S. Appl. No. 12/904,047 of Atwater, H. et al. filed Oct. 13, 2010.
\*\*Corrected Notice of Allowability dated Apr. 20, 2015 for U.S. Appl. No. 13/451,455 of Nie, H. et al. filed Jul. 19, 2012.
\*\*Corrected Notice of Allowability dated Aug. 17, 2015 for U.S. Appl. No. 13/451,455 of Nie, H. et al. filed Jul. 19, 2012.
\*\*Corrected Notice of Allowability dated Jun. 29, 2015 for U.S. Appl. No. 13/451,455 of Nie, H. et al. filed Jul. 19, 2012.
\*\*European Search Report dated Sep. 19, 2017 for European Patent Application No. 11187659.5, 11 pages.
\*\*Ex Parte Quayle Action dated Nov. 18, 2016 for U.S. Appl. No. 13/705,064 of Kayes, B.M. et al. filed Dec. 4, 2012.
\*\*Final Office Action dated Apr. 10, 2014 for U.S. Appl. No. 13/772,043 of Archer, M.J. et al. filed Feb. 20, 2013.
\*\*Final Office Action dated Apr. 20, 2017 for U.S. Appl. No. 13/446,876 of Kayes, B.M. et al. filed Apr. 13, 2012.
\*\*Final Office Action dated Apr. 26, 2012 for U.S. Appl. No. 12/605,108 of Kizilyalli, I.C. et al. dated Nov. 23, 2009.
\*\*Final Office Action dated Apr. 28, 2011 for U.S. Appl. No. 12/605,108 of Kizilyalli, I.C. et al. dated Nov. 23, 2009.
\*\*Final Office Action dated Aug. 14, 2014 for U.S. Appl. No. 13/354,175 of Higashi, G. et al. filed Jan. 19, 2012.
\*\*Final Office Action dated Feb. 1, 2016 for U.S. Appl. No. 12/904,047 of Atwater, H. et al. filed Oct. 13, 2010.
\*\*Final Office Action dated Feb. 8, 2016 for U.S. Appl. No. 13/772,043 of Archer, M.J. et al. filed Feb. 20, 2013.
\*\*Final Office Action dated Jan. 26, 2017, for Korean Patent Application No. KR-20127012346, 4 pages.
\*\*Final Office Action dated Jan. 29, 2016 for U.S. Appl. No. 13/446,876 of Kayes, B.M. et al. filed Apr. 13, 2012.
\*\*Final Office Action dated Mar. 4, 2016 for U.S. Appl. No. 14/696,106 of Kayes, Brendan M. filed Apr. 24, 2015.
\*\*Final Office Action dated Mar. 8, 2017 for U.S. Appl. No. 15/006,003 of Kayes, B.M. et al. filed Jan. 25, 2016.
\*\*Final Office Action dated Nov. 6, 2015 for U.S. Appl. No. 13/705,064 of Kayes, B.M. et al. filed Dec. 4, 2012.
\*\*Final Office Action dated Oct. 18, 2011, for U.S. Appl. No. 12/940,876 of Kizilyalli, I.C. et al. filed Nov. 10, 2010.
Final Office Action dated Oct. 28, 2016 for U.S. Appl. No. 14/846,675 of Kayes, B.M. et al. filed Sep. 4, 2015.
\*\*Final Office Action dated Sep. 11, 2017 for U.S. Appl. No. 12/904,047 of Atwater, H. et al. filed Oct. 13, 2010.
\*\*Final Office Action dated Sep. 16, 2011 for U.S. Appl. No. 12/940,861 of Kizilyalli, I.C. et al. filed Nov. 5, 2010.
\*\*Final Office Action dated Sep. 22, 2017 for U.S. Appl. No. 13/772,043 of Archer, M.J. et al. filed Feb. 20, 2013.
\*\*First Office Action dated Jun. 7, 2016 for Korean Patent Application No. KR-20127012346, 6 pages.
\*\*First Office Action dated Nov. 30, 2016 for Chinese Patent Application No. 201510475349.5, 21 pages.
\*\*International Search Report and Written Opinion dated Jun. 1, 2010 for International Application No. PCT/US2009/061898 (ALTA/004PC).
\*\*International Search Report and Written Opinion dated Jun. 1, 2010 for International Application No. PCT/US2009/061906 (ALTA/0005PCT).
\*\*International Search Report and Written Opinion Dated Jun. 1, 2010 for International Application No. PCT/US2009/061911 (ALTA/0006PCT).
\*\*International Search Report and Written Opinion dated Jun. 1, 2010 for International Application No. PCT/US2009/061914 (ALTA0007PCT).
\*\*International Search Report and Written Opinion dated Jun. 1, 2010 for International Application No. PCT/US2009/061920 (ALTA/0008PCT).
\*\*International Search Report and Written Opinion dated Dec. 2, 2016 for International Patent Application No. PCT/US2016/052939, 12 pages.
\*\*International Search Report and Written Opinion dated May 23, 2016 for International Patent Application No. PCT/US2016/014866, 12 pages.
\*\*International Search Report and Written Opinion dated May 8, 2017 for International Patent Application No. PCT/US2017/015387, 10 pages.
\*\*Non-Final Office Action dated Apr. 25, 2015 for U.S. Appl. No. 13/705,064 of Kayes, B.M. et al. filed Dec. 4, 2012.
\*\*Non-Final Office Action dated Apr. 7, 2016 for U.S. Appl. No. 13/705,064 of Kayes, B.M. et al. filed Dec. 4, 2012.

(56) References Cited

OTHER PUBLICATIONS

Non-Final Office Action dated Apr. 7, 2016 for U.S. Appl. No. 14/846,675 of Kayes, B.M. et al. filed Sep. 4, 2015.
\*\*Non-Final Office Action dated Apr. 7, 2017 for U.S. Appl. No. 13/772,043 of Archer, M.J. et al. filed Feb. 20, 2013.
Non-Final Office Action dated Aug. 16, 2017 for U.S. Appl. No. 14/846,675 of Kayes, B.M. et al. filed Sep. 4, 2015.
\*\*Non-Final Office Action dated Aug. 19, 2011 for U.S. Appl. No. 12/605,108 of Kizilyalli, I.C. et al. dated Nov. 23, 2009.
\*\*Non-Final Office Action dated Jan. 16, 2014 for U.S. Appl. No. 12/904,047 of Atwater, H. et al. filed Oct. 13, 2010.
\*\*Non-Final Office Action dated Jan. 30, 2014 for U.S. Appl. No. 13/354,175 of Higashi, G. et al. filed Jan. 19, 2012.
\*\*Non-Final Office Action dated Jul. 16, 2015 for U.S. Appl. No. 13/446,876 of Kayes, B.M. et al. filed Apr. 13, 2012.
\*\*Non-Final Office Action dated Jul. 16, 2015 for U.S. Appl. No. 13/772,043 of Archer, M.J. et al. filed Feb. 20, 2013.
\*\*Non-Final Office Action dated Jul. 30, 2015 for U.S. Appl. No. 12/904,047 of Atwater, H. et al. filed Oct. 13, 2010.
\*\*Non-Final Office Action dated Jun. 28, 2016 for U.S. Appl. No. 13/446,876 of Kayes, B.M. et al. filed Apr. 13, 2012.
\*\*Non-Final Office Action dated Mar. 17, 2011, for U.S. Appl. No. 12/940,861 of Kizilyalli, I.C. et al. filed Nov. 5, 2010.
\*\*Non-Final Office Action dated Mar. 17, 2011, for U.S. Appl. No. 12/940,876 of Kizilyalli, I.C. et al. filed Nov. 10, 2010.
\*\*Non-Final Office Action dated May 11, 2017 for U.S. Appl. No. 14/692,647 of Kayes, Brendan M. et al. filed Apr. 21, 2015.
\*\*Non-Final Office Action dated May 31, 2016 for U.S. Appl. No. 12/904,047 of Atwater, H. et al. filed Oct. 13, 2010.
\*\*Non-Final Office Action dated Nov. 17, 2010 for U.S. Appl. No. 12/605,108 of Kizilyalli, I.C. et al. dated Nov. 23, 2009.
\*\*Non-Final Office Action dated Nov. 17, 2015 for U.S. Appl. No. 14/696,106 of Kayes, Brendan M. filed Apr. 24, 2015.
\*\*Non-Final Office Action dated Nov. 2, 2017 for U.S. Appl. No. 15/340,560 of Ding, I.-K. et al. filed Nov. 1, 2016.
\*\*Non-Final Office Action dated Sep. 22, 2016 for U.S. Appl. No. 15/006,003 of Kayes, B.M. et al. filed Jan. 25, 2016.
\*\*Non-Final Office Action dated Sep. 26, 2013 for U.S. Appl. No. 13/772,043 of Archer, M.J. et al. filed Feb. 20, 2013.
\*\*Notice of Allowance dated Aug. 12, 2014, for U.S. Appl. No. 12/940,876 of Kizilyalli, I.C. et al. filed Nov. 10, 2010.
\*\*Notice of Allowance dated Aug. 17, 2015 for U.S. Appl. No. 14/452,393 of Ding, I.-K. et al. filed Aug. 5, 2014.
\*\*Notice of Allowance dated Aug. 26, 2016 for U.S. Appl. No. 14/696,106 of Kayes, Brendan M. filed Apr. 24, 2015.
\*\*Notice of Allowance dated Dec. 20, 2017 for U.S. Appl. No. 14/692,647 of Kayes, Brendan M. et al. filed Apr. 21, 2015.
\*\*Notice of Allowance dated Jan. 2, 2015 for U.S. Appl. No. 13/354,175 of Higashi, G. et al. filed Jan. 19, 2012.
\*\*Notice of Allowance dated Jul. 13, 2014 for U.S. Appl. No. 12/940,861 of Kizilyalli, I.C. et al. filed Nov. 5, 2010.
\*\*Notice of Allowance dated Jul. 27, 2016 for U.S. Appl. No. 14/452,393 of Ding, I.-K. et al. filed Aug. 5, 2014.
\*\*Notice of Allowance dated Jun. 19, 2014 for U.S. Appl. No. 12/605,108 of Kizilyalli, I.C. et al. dated Nov. 23, 2009.
\*\*Notice of Allowance dated Jun. 2, 2015 for U.S. Appl. No. 13/354,175 of Higashi, G. et al. filed Jan. 19, 2012.
\*\*Notice of Allowance dated Mar. 4, 2016 for U.S. Appl. No. 14/452,393 of Ding, I.-K. et al. filed Aug. 5, 2014.
\*\*Notice of Allowance dated May 5, 2017 for U.S. Appl. No. 13/705,064 of Kayes, B.M. et al. filed Dec. 4, 2012.
\*\*Notice of Allowance dated Oct. 20, 2016 for U.S. Appl. No. 12/904,047 of Atwater, H. et al. filed Oct. 13, 2010.
\*\*Notice of Allowance dated Feb. 27, 2015 for U.S. Appl. No. 13/451,455 of Nie, H. et al. filed Jul. 19, 2012.
\*\*Notice of Allowance dated Jan. 26, 2015 for U.S. Appl. No. 13/451,455 of Nie, H. et al. filed Jul. 19, 2012.
\*\*Notice of Allowance with Corrected Notice of Allowability dated Feb. 28, 2017 for U.S. Appl. No. 12/904,047 of Atwater, H. et al. filed Oct. 13, 2010.

Office Action dated Jun. 23, 2016, for Chinese Patent Application No. 201110329046.4.
\*\*Restriction Requirement dated Dec. 26, 2014 for U.S. Appl. No. 13/446,876 of Kayes, B.M. et al. filed Apr. 13, 2012.
\*\*Restriction Requirement dated Dec. 28, 2017 for U.S. Appl. No. 15/422,218 of Zhu, Y. et al. filed Feb. 1, 2017.
\*\*Restriction Requirement dated Jan. 22, 2013 for U.S. Appl. No. 12/904,047 of Atwater, H. et al. filed Oct. 13, 2010.
\*\*Restriction Requirement dated Jun. 22, 2016 for U.S. Appl. No. 15/006,003 of Kayes, B.M. et al. filed Jan. 25, 2016.
\*\*Restriction Requirement dated Nov. 18, 2016, for U.S. Appl. No. 14/692,647 of Kayes, Brendan M. et al. filed Apr. 21, 2015.
\*\*Restriction Requirement dated Oct. 24, 2014 for U.S. Appl. No. 13/705,064 of Kayes, B.M. et al. filed Dec. 4, 2012.
\*\*Supplementary Search Report dated Sep. 18, 2017 for Chinese Patent Application No. 201510475349.5, 1 page.
\*\*U.S. Appl. No. 15/706,090 of Kayes, B.M. et al. filed Sep. 15, 2017.
\*\*First Office Action dated Jun. 5, 2014, for Chinese Patent Application No. 201080046469 filed Oct. 14, 2010, 23 pages, dated Jun. 5, 2014.
\*\*Aisaka, et al., "Enhancement of upconversion Luminescence of Er Doped Al2O3 Films by Ag Islands Films", Applied Physics Letters 92, 132105, Apr. 1, 2008, pp. 1-3.
\*\*Biteen, et al., "Spectral Tuning of Plasmon-enhanced Silicon Quantum Dot Luminescence", Applied Physics Letters 88, 131109, Mar. 31, 2006, pp. 1-3.
\*\*Dionne, et al., "Highly Confined Photon Transport in Subwavelength Metallic Slot Waveguides", Nano Lett., vol. 6, No. 9 Jun. 20, 2006, pp. 1928-1932.
\*\*Floyd, B. H. et al., "AN N—AlGaAs P—GaAs Graded Heterojunction for High Concentration Ratios", IEEE, 1987, 81-86.
\*\*Heckelmann, Stefan et al., "Investigations on AlxGa1—xAs Solar Cells Grown by MOVPE", IEEE Journal of Photovoltaics, IEEE, US, vol. 5, No. 1, Dec. 18, 2014, pp. 446-453.
\*\*Hübner, A. et al., "Novel cost-effective bifacial silicon solar cells with 19.4% front and 18.1% rear efficiency", Applied physics letters 70(8), 1997, pp. 1008-1010.
\*\*Lenkeit, B. et al., "Excellent thermal stability of remote plasma-enhanced chemical vapour deposited silicon nitride films for the rear of screen-printed bifacial silicon solar cells", Solar energy materials and solar cells 65(1), 2001, pp. 317-323.
\*\*Lewis, Peter A. , "Pigment Handbook vol. I: Properties and Economics, 2nd Edition", John Wiley & Songs, New York, 1988, 790-791.
\*\*Lezec, et al., "Negative Refraction at Visible Frequencies", Science. vol. 316, Apr. 20, 2007, pp. 430-432.
\*\*Mathews, Ian et al., "GaAs solar cells for Indoor Light Harvesting", 2014 IEEE 40th Photovoltaic Specialist Conference (PVSC), IEEE, Jun. 8, 2014, pp. 510-513.
\*\*McClelland, R.W. et al., "High-Efficiency Thin-Film GAAS Bifacial Solar Cells", Proceedings of IEEE Photovoltaic Specialists Conference, 1990,, May 21, 1990-May 25, 1990, pp. 145-147.
\*\*Nielson, et al., "Microfabrication of microsystems-enabled photovoltaic (MEPV) cells", Proceedings of the International Society of Optics and Photonics (SPIE) [online] Retreived from the internet: <URL: http:// photovoltaics.sandia.gov/Pubs_2010/2011/Microfab_of_MEPV_Cells_SPIE_2011.pdf> See entire document especially D Figure 5, p. 5, Jan. 25, 2011, Figure 5, p. 5.
\*\*Ohtsuka, H. et al., "Effect of light degradation on bifacial Si solar cells", Solar energy materials and solar cells 66(1), 2001, pp. 51-59.
\*\*Othaman, Z. et al., "The Stranski-Krastanov Three Dimensional Island Growth Prediction on Finite Size Model", Journal of Physics UTM 3, 2008, pp. 78-83.
\*\*Pacifici, et al., "Quantitative Determination of Optical Transmission through Subwavelength Slit Arrays in Ag films:The Essential role of Surface Wave Interference and Local Coupling between Adjacent Slits", Thomas J. Watson Lab. of Appl. Phys., Oct. 22, 2007, pp. 1-4.
\*\*Park, et al., "Surface Plasmon Enhanced Photoluminescence of Conjugated Polymers", Appl. Phys.Letters 90, 161107, Apr. 17, 2007, pp. 1-3.

(56) References Cited

OTHER PUBLICATIONS

\*\*Pillai, et al., "Enhanced emission from Si-based Light-emitting Diodes using Surface Plasmons", Applied Physics Letters, 88, 161102, Apr. 17, 2006, pp. 1-3.

\*\*Sanfacon, M. M. et al., "Analysis of AlGaAs/GaAs Solar Cell Structures by Optical Reflectance Spectroscopy", IEEE Transactions on Electron Devices, vol. 37, No. 2, Feb. 1990, 450-454.

\*\*Takamoto, Tatsuya et al., "Paper-Thin InGaP/GaAs Solar Cells", IEEE PVSC Proceedings, 2006, 1769-1772.

\*\*Tanabe, et al., "Direct-bonded GaAs/InGaAs Tandem Solar Cell", Appl. Phys. Lett. 89, 102106, Sep. 6, 2006, pp. 1-3.

\*\*Tsatsul'nikov, A.F. et al., "Volmer-Weber and Stanski-Krastanov InAs..As quantum dots emitting at 1.3 μm", Journal of Applied Physics, vol. 88, No. 11, 2000, pp. 6272-6275.

\*\*Van Geelen, A. et al., "Epitaxial lift-off GaAs solar cell from a reusable GaAs substrate", Materials Science and Engineering: B, vol. 45, No. 1-3, Mar. 1997, pp. 162-171.

\*\*Van Wijngaarden, et al., "Direct Imaging of Propagation and Damping of Near-Resonance Surface Plasmon Polaritons using Cathodoluminescence Spectroscopy", Appl. Phys. Lett. 88, 221111, Jun. 1, 2006, pp. 1-3.

\*\*Yamaguchi, Hiroshi et al., "Development Status of "Space Solar Sheet"", IEEE PVSC Proceedings, 2008.

\*\*Yazawa, Y. et al., "GaInP single-junction and GaInP/GaAs two-junction thin-film solar cell structures by epitaxial lift-off", Solar Energy Materials and Solar Cells, vol. 50, No. 1-4, 1998, pp. 229-235.

\*\*Zhang, Q. M. et al., "Effects of Displaced p-n Junction of Heterojunction Bipolar Transistors", IEEE Transactions on Electron Devices, vol. 39, No. 11, 11/92, 2430-2437.

International Search Report dated Dec. 2, 2016 issued in International Patent application No. PCT/US2016/052939.

Kang et al., "Ultra-thin Film Nano-structured Gallium Arsenide Solar Cells, "Proc. of SPIE, vol. 9277, No. 927718, pp. 1-7.

McPheeters et al., "Computational analysis of thin film inGaAs/GaAs quantum well solar cells with back side light trapping structures,"Optics Express, vol. 20, No. S6, pp. A864-A878 (Nov. 5, 2012).

Mellor et al., "A numerical study of Bi-periodic binary diffraction gratings for solar cell applications," Solar Energy Materials & Solar Cells 95 (2011) 3527-3535.

Yang et al., "Ultra-Thin GaAs Single-Junction Solar Cells Integrated with an AlInP Layer for Reflective Back Scattering," (4 total pages).

Korean Office Action dated Jun. 7, 2016 issued in Korean Patent Application No. 10-2012-7012346 (Translation).

Second Written Opinion dated Aug. 1, 2017 issued in International Patent Application No. PCT/US2016/052939.

\* cited by examiner

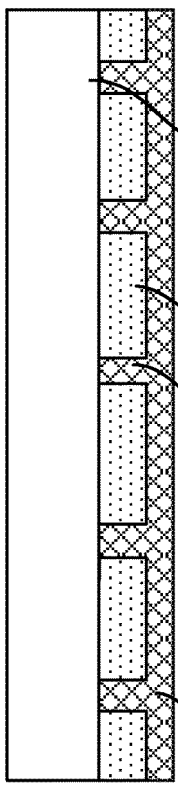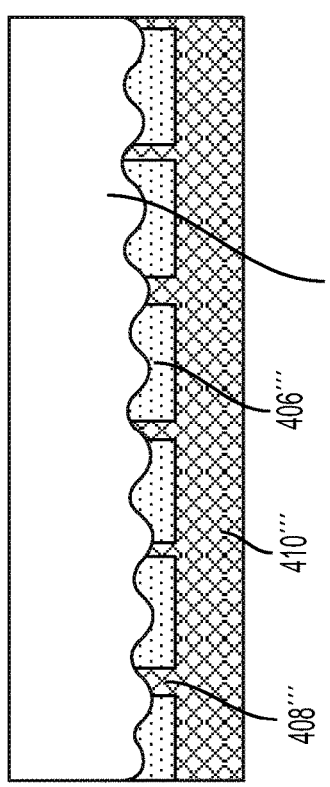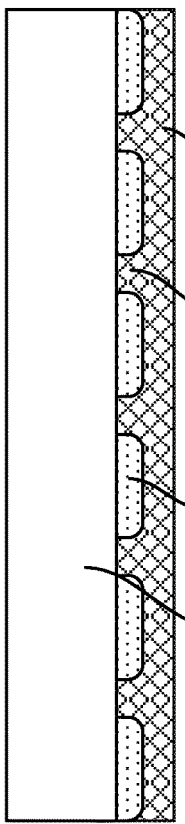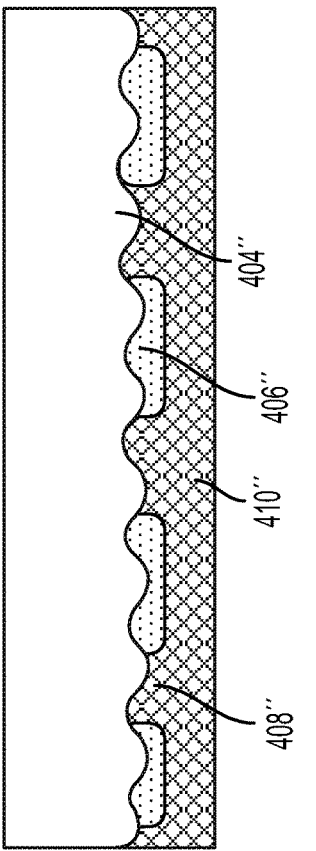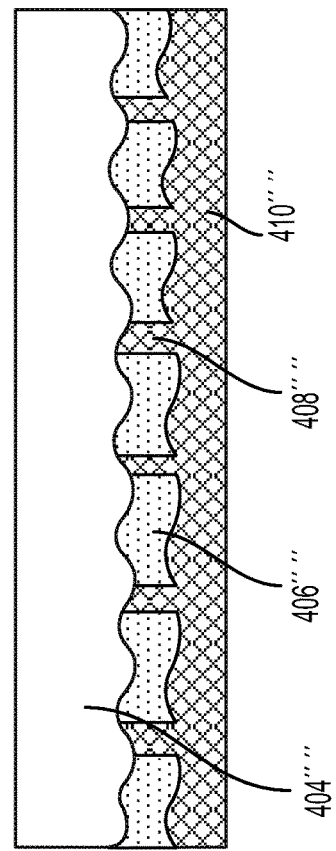

OPTOELECTRONIC DEVICE WITH DIELECTRIC LAYER AND METHOD OF MANUFACTURE

This application is a divisional of U.S. patent application Ser. No. 14/846,675, titled, OPTOELECTRONIC DEVICE WITH DIELECTRIC LAYER AND METHOD OF MANUFACTURE filed on Sep. 4, 2015, which is a continuation-in-part of U.S. patent application Ser. No. 12/904,047, titled, TEXTURED METALLIC BACK REFLECTOR filed on Oct. 13, 2010, a continuation-in-part of U.S. patent application Ser. No. 13/446,876 filed on Apr. 13, 2012, titled, OPTOELECTRONIC DEVICE WITH NON-CONTINUOUS BACK CONTACTS, a continuation-in-part of U.S. patent application Ser. No. 13/354,175 titled, TEXTURING A LAYER IN AN OPTOELECTRONIC DEVICE FOR IMPROVED ANGLE RANDOMIZATION OF LIGHT, filed on Jan. 19, 2012 and a continuation-in-part of U.S. patent application Ser. No. 14/452,393, titled, THIN-FILM SEMICONDUCTOR OPTOELECTRONIC DEVICE WITH TEXTURED FRONT AND/OR BACK SURFACE PREPARED FROM TEMPLATE LAYER AND ETCHING, filed on Aug. 5, 2014. Each of the above-mentioned applications is incorporated by reference herein in its entirety.

FIELD OF THE INVENTION

The present invention relates generally to fabrication of optoelectronic devices and more particularly to optoelectronic devices including a dielectric layer.

BACKGROUND OF THE INVENTION

It is sometimes desirable to improve the reflectivity of the back surface of an optoelectronic device such as a photovoltaic cell or a light-emitting diode to improve the performance thereof without significantly affecting the cost or adding to overall size of the device. Accordingly, there is a need to provide such an improvement while addressing the above identified issues. The present invention addresses such a need.

SUMMARY OF THE INVENTION

An optoelectronic device and a method for fabricating the optoelectronic device are disclosed. The optoelectronic device comprises a p-n structure, a patterned dielectric layer on the p-n structure and a metal layer disposed on the dielectric layer. The dielectric layer comprises a dielectric material, wherein the dielectric material is chemically resistant to acids and provides adhesion to the p-n structure and the metal layer. The metal layer makes one or more contacts to the p-n structure through one or more openings in the patterned dielectric layer.

A method for fabricating an optoelectronic device comprises providing an epitaxially grown p-n structure, providing a dielectric layer on the p-n structure and providing a metal layer on the dielectric layer and then lifting the device off the substrate, such that after the lift off the p-n structure is closer than the patterned dielectric layer to a front side of the device; wherein the device comprises the p-n structure, the patterned dielectric layer, and the metal layer. The dielectric layer comprises a dielectric material and has a chemical resistance to acids and provides adhesion to the p-n structure and the metal layer.

In an embodiment, the method comprises providing a p-n structure; directly patterning a dielectric material on the p-n structure; and providing a metal layer on the dielectric material, wherein the dielectric material has a chemical resistance to acids and provides adhesion to the p-n structure and the metal layer. The method further includes providing one or more contact between the p-n structure and the metal layer.

BRIEF DESCRIPTION OF THE DRAWINGS

The appended drawings illustrate only some embodiments and are therefore not to be considered limiting of scope.

FIGS. 4a-e depict exemplary embodiments of an optoelectronic device comprising a dielectric layer according to the present invention.

DETAILED DESCRIPTION

Figure 1:
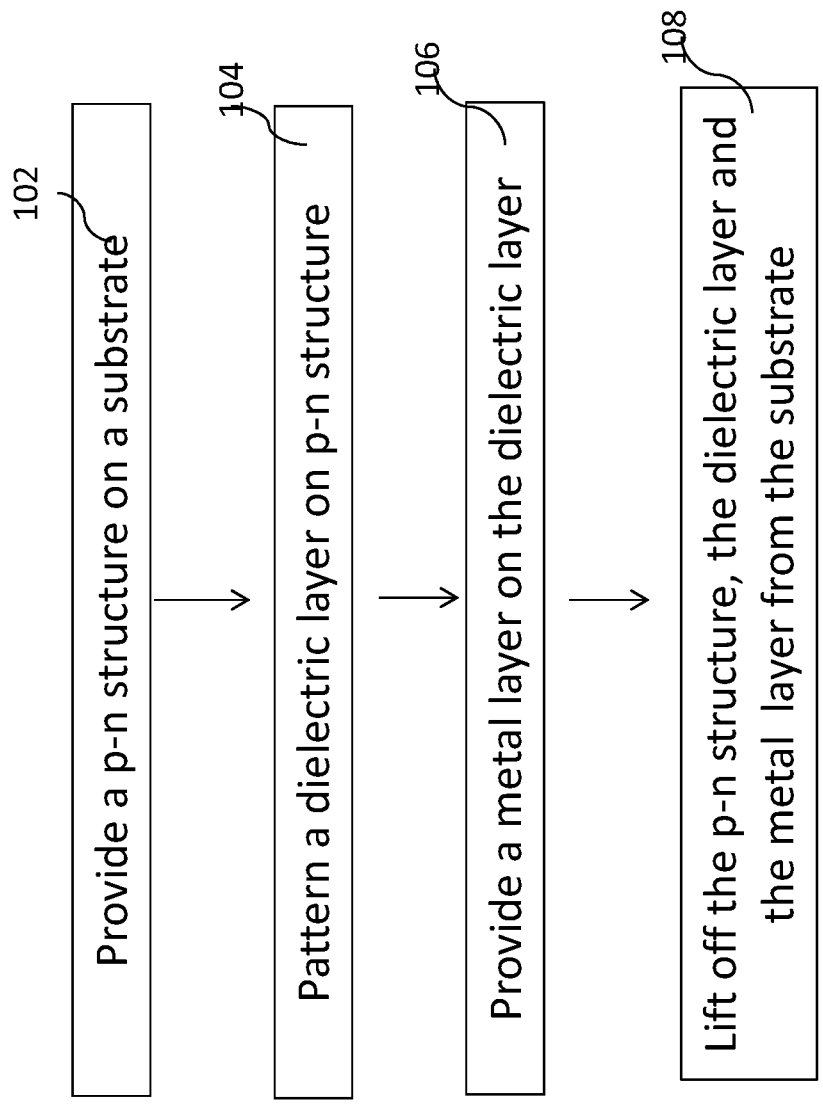
FIG. 1 illustrates a flow chart depicting a process for forming an optoelectronic device comprising a dielectric layer according to embodiments described herein.

The present invention relates generally to optoelectronic devices and more particularly to an optoelectronic device with a dielectric layer. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Embodiments of the inventions generally relate to optoelectronic devices more specifically to optoelectronic semiconductor devices including one or more textured layers and the fabrication processes for forming such optoelectronic devices. Embodiments of the invention also relate to the fabrication of thin film devices, such as photovoltaic devices, light-emitting diodes, or other optoelectronic devices, which contain a dielectric layer on the back side.

A method for forming an optoelectronic device comprising a dielectric layer according to an embodiment of the invention is described herein. In an embodiment, the method comprises providing a p-n structure deposited on a substrate. A dielectric layer is then patterned on the p-n structure thus formed providing one or more openings for electrical contacts. A metallic layer is then disposed on the dielectric layer such that the metal layer makes one or more contacts with the p-n structure through the openings provided in the dielectric layer. The p-n structure, the dielectric layer and the metal layer are then lifted off the substrate. Embodiments may also provide back reflectors which are metallic reflectors or metal-dielectric reflectors.

Many of the thin film devices described herein generally contain epitaxially grown layers which are formed on a sacrificial layer disposed on or over a support substrate or wafer. The thin film devices thus formed may be flexible single crystal devices. Once the thin film devices are formed by epitaxy processes, the thin film devices are subsequently removed from a support substrate or wafer, for example during an epitaxial lift off (ELO) process, a laser lift off (LLO) process, ion implantation and liftoff, liftoff by etching of a buried oxide layer or a buried porous layer, or a spalling process etc.

Herein, a layer can be described as being deposited "on or over" one or more other layers. This term indicates that the layer can be deposited directly on top of the other layer(s), or can indicate that one or more additional layers can be deposited between the layer and the other layer(s) in some embodiments. Also, the other layer(s) can be arranged in any order. To describe the features of the present invention in more detail refer now to the following discussion in conjunction with the accompanying figures.

FIG. 1 illustrates a flow chart depicting a process for forming an optoelectronic device comprising a dielectric layer according to embodiments described herein. In an embodiment, the method comprises providing a p-n structure on a substrate via step 102.

In some embodiments, a sacrificial layer may be disposed on the substrate prior to deposition of the p-n structure, for example to enable liftoff of the p-n structure in an epitaxial liftoff (ELO) process. The sacrificial layer may comprise AlAs, AlGaAs, AlGaInP, or AlInP, or other layers with high Al content, or combinations thereof and is utilized to form a lattice structure for the layers contained within the cell, and then etched and removed during the ELO process. In other embodiments, alternative liftoff processes such as laser lift off (LLO), ion implantation and liftoff, liftoff by etching of a buried oxide layer or a buried porous layer, or spalling may be used.

In an embodiment, the p-n structure may be grown on a substrate, for example, a gallium arsenide wafer may be used, with epitaxially grown layers as thin films made of Group III-V materials. Alternatively, a germanium wafer, or an indium phosphide wafer, or a sapphire wafer, or a gallium nitride wafer, or a silicon wafer may be used. The p-n structure may be formed by epitaxial growth using various techniques, for example, metalorganic chemical vapor deposition (MOCVD), molecular beam epitaxy (MBE), metalorganic vapor phase epitaxy (MOVPE or OMVPE), liquid phase epitaxy (LPE), hydride vapor phase epitaxy (HVPE), etc. In some embodiments, the p-n structure is substantially a single crystal.

In some embodiments, the epitaxially grown layers of Group III-V materials can be formed using a high growth rate vapor deposition process. The high growth rate deposition process allows for growth rates of greater than 5 μm/hr, such as about 10 μm/hr or greater, or as high as about 100 μm/hr or greater. The high growth rate process includes heating a wafer to a deposition temperature of about 550° C. or greater, within a processing system, exposing the wafer to a deposition gas containing a chemical precursor, such as a group III-containing precursor gas and a group V-containing precursor gas, and depositing a layer containing a Group III-V material on the wafer. The group III-containing precursor gas may contain a group III element, such as indium, gallium, or aluminum. For example, the group III-containing precursor gas may be chosen from the list: trimethyl aluminum, triethyl aluminum, trimethyl gallium, triethyl gallium, trimethyl indium, triethyl indium, di-isopropylmethylindium, ethyldimethylindium. The group V-containing precursor gas may contain a group V element, such as nitrogen, phosphorus, arsenic, or antimony. For example, the group V-containing precursor gas may be chosen from the list: phenyl hydrazine, dimethylhydrazine, tertiarybutylamine, ammonia, phosphine, tertiarybutyl phosphine, bisphosphinoethane, arsine, tertiarybutyl arsine, monoethyl arsine, trimethyl arsine, trimethyl antimony, triethyl antimony, triisopropyl antimony, stibine.

The deposition processes for depositing or forming Group III-V materials, as described herein, can be conducted in various types of deposition chambers. For example, one continuous feed deposition chamber that may be utilized for growing, depositing, or otherwise forming Group III-V materials is described in the commonly assigned U.S. patent application Ser. Nos. 12/475,131 and 12/475,169, both filed on May 29, 2009, which are herein incorporated by reference in their entireties.

Some examples of layers usable in device and methods for forming such layers are disclosed in copending U.S. patent application Ser. No. 12/939,077, filed Nov. 3, 2010, and incorporated herein by reference in its entirety.

The p-n structure may contain various arsenide, nitride, and phosphide layers, such as but not limited to GaAs, AlGaAs, InGaP, InGaAs, AlInGaP, AlInGaAs, InGaAsP, AlInGaAsP, GaN, InGaN, AlGaN, AlInGaN, GaP, alloys thereof, derivatives thereof and combinations thereof. In general, the p-n structure comprises a Group III-V semiconductor and includes at least one of the group consisting of: gallium, aluminum, indium, phosphorus, nitrogen, and arsenic. In one embodiment, the p-n structure comprises gallium arsenide material, and derivatives thereof.

For example, in one embodiment the p-n structure comprises a p-type aluminum gallium arsenide layer or stack disposed above an n-type gallium arsenide layer or stack. In one example, the p-type aluminum gallium arsenide stack has a thickness within a range from about 100 nm to about 3,000 nm and the n-type gallium arsenide stack has a thickness within a range from about 100 nm to about 3,000 nm. In one example, the n-type gallium arsenide stack has a thickness within a range from about 700 nm to about 2500 nm.

In another embodiment, the p-n structure comprises indium gallium phosphide material, and derivatives thereof. The indium gallium phosphide material may contain various indium gallium phosphide layers, such as an indium gallium phosphide, aluminum indium gallium phosphide, etc. For example, in one embodiment the p-n structure comprises a p-type aluminum indium gallium phosphide layer or stack disposed above an n-type indium gallium phosphide layer or stack.

In one example, the p-type aluminum indium gallium phosphide stack has a thickness within a range from about 100 nm to about 3,000 nm and the n-type indium gallium phosphide stack has a thickness within a range from about 100 nm to about 3,000 nm. In one example, the n-type indium gallium phosphide stack has a thickness within a range from about 400 nm to about 1,500 nm.

In another embodiment, the p-n structure comprises indium gallium arsenide phosphide material, and derivatives thereof. The indium gallium arsenide phosphide material may contain various indium gallium arsenide phosphide layers, such as an indium gallium phosphide, aluminum indium gallium phosphide, indium gallium arsenide phosphide, aluminum indium gallium arsenide phosphide etc. For example, in one embodiment the p-n structure comprises a p-type aluminum indium gallium phosphide layer or stack disposed above an n-type indium gallium arsenide phosphide layer or stack.

In another embodiment, the p-n structure comprises aluminum indium gallium phosphide material, and derivatives thereof. The aluminum indium gallium phosphide material may contain various aluminum indium gallium phosphide layers, such as an aluminum indium phosphide, aluminum indium gallium phosphide, etc. For example, in one embodiment the p-n structure comprises a p-type aluminum indium phosphide layer or stack disposed above an n-type aluminum indium gallium phosphide layer or stack.

In another embodiment, the p-n structure comprises multiple p-n junctions. Each p-n junction may contain various arsenide, nitride, and phosphide layers, such as GaAs, AlGaAs, InGaP, InGaAs, AlInGaP, AlInGaAs, InGaAsP, AlInGaAsP, GaN, InGaN, AlGaN, AlInGaN, GaP, alloys thereof, derivatives thereof and combinations thereof. In general, each p-n junction comprises a Group III-V semiconductor and includes at least one of the group consisting of: gallium, aluminum, indium, phosphorus, nitrogen, and arsenic.

Furthermore, the junction formed between the two layers can be a heterojunction that is, the N-layer and P-layer could be of different material or a homojunction, that is, both the N-layer and P-layer could be the same material (both layers being GaAs or both layers InGaP, for example) and that would be within the spirit and scope of the present invention. Also, the p-n structure could have either doping polarity, with n-type material at the top of the device and p-type material at the bottom, or alternatively with p-type material at the top of the device and n-type material at the bottom. Furthermore, the optoelectronic device could be comprised of multiple p-n layers grown in series, for example, to form a multijunction photovoltaic cell.

In some embodiments, the p-n structure may comprise a textured surface. This textured surface can improve the scattering of light at that surface, as well as improve adhesion to both metal and dielectric layers. In some embodiments, the texturing is achieved during the growth of the materials that comprise the p-n structure. This may be achieved at least in part for by exploiting a lattice mismatch between at least two materials in the p-n structure, for example in a Stranski-Krastanov process or a Volmer-Weber process. In another embodiment, a layer in or on the p-n structure may act as an etch mask and texturing can be provided by an etching process. In yet another embodiment, texturing may be provided by physical abrasion such as sandpaper or sandblasting or particle blasting or similar processes.

In addition, in an embodiment, the back side and/or the front side of the p-n structure can be textured to improve light scattering into and/or out of the device.

Referring back to FIG. 1, a dielectric layer is then patterned on the p-n structure, via step 104 providing one or more openings for electrical contacts. In one embodiment, a dielectric layer with an array of openings is disposed on a p-n structure, forming a plurality of apertures extending into the p-n structure. In an embodiment, the openings for electrical contacts may be patterned such that front metal contacts and openings for electrical contact to back metal layer are offset to prevent short circuits. In another embodiment, the front and back metal contacts may be aligned.

In an embodiment, the dielectric layer is disposed by using various methods such as but not limited to spin coating, dip coating, spray coating, physical vapor deposition (PVD) (including sputtering, evaporation, and electron-beam evaporation, etc.), chemical vapor deposition (CVD) (including metalorganic chemical vapor deposition (MOCVD), atmospheric pressure chemical vapor deposition (APCVD), low pressure chemical vapor deposition (LP-CVD), plasma-enhanced chemical vapor deposition (PECVD), ion-beam assisted chemical vapor deposition (IBAD CVD), etc.), atomic layer deposition (ALD), powder coating, sol gel, chemical bath deposition (CBD), close space sublimation (CSS), inkjet printing, screen printing and lamination. The patterning of the dielectric layer can achieved either directly during the dielectric disposition process, for example in a printing process or by using a shadow mask, or indirectly in a process subsequent to the disposition process by using various techniques comprising wet or dry etching through the dielectric layer, patterning the dielectric layer using photolithography, electron-beam lithography, imprint lithography, and laser ablation etc.

What is meant by "directly patterning" is that the pattern is provided during the dielectric deposition in an additive process, without the need for a subsequent subtractive step to remove significant amounts of dielectric to form the pattern, for example using inkjet printing, shadow masking, or screen printing, etc. What is meant by "indirect patterning" is that there is a patterning step subsequent to the dielectric deposition step, usually in a subtractive process or combination of processes, such as in wet or dry etching, photolithography, electron-beam lithography, imprint lithography, or laser ablation, etc.

For depositing a dielectric layer using an inkjet printing technique, a dielectric material of specific viscosity and drying properties is used such that the dielectric material is liquid during the application process and becomes solid after optional curing. Depending on the properties of the dielectric material used, it can be cured at elevated temperature or under ultraviolet light if required, or simply at room temperature, for example by evaporation of solvent components in the dielectric material. If the dielectric material used is photosensitive it may be cured using light and if the dielectric material used is not photosensitive it may be cured using heat. For some dielectric materials, a combination of light and heat may be used for curing.

The dielectric layer may have a thickness within a range from about 10 nm to about 10 µm, preferably, from about 20 nm to about 2000 nm, and more preferably, from about 50 nm to about 1000 nm. In some embodiments, the thickness of the dielectric layer may differ substantially based on the technique used for deposition of the dielectric layer. For example, the thickness of the dielectric layer deposited using screen printing may be different from that deposited using inkjet printing. For example, typical film thickness obtained using inkjet printing after curing is in the range of about 10 nm to about 10 µm, more typically in the range of about 100 nm to about 1000 nm, more typically about 500 nm. Thinner layers are generally harder to control as they require better control of the spreading.

In some embodiments, the dielectric layer has openings to provide for electrical connection between layers above and below the dielectric. Each opening within the dielectric layer may have a diameter within a range from about 5µ to about 1000 µm, and preferably from about 20 µm to about 500 µm. Typical via width obtained by inkjet printing is in the range of about 10 µm to about 1000 µm, for example 50 µm-500 µm, and more typically 60 µm-250 µm. Smaller via width is generally preferred but is generally harder to control. In other embodiments, the dielectric layer has no openings and an electrical connection is provided by the dielectric layer itself.

In one embodiment, the dielectric layer comprises organic or inorganic dielectric materials that are resistant to etching by acids such as hydrochloric acid, sulfuric acid or hydrofluoric acid, for example during an epitaxial lift off (ELO) process. The dielectric materials can also be transparent and provide adhesion to both metal and semiconductor layers.

The dielectric materials can also be electrically insulating or electrically conducting. The organic dielectric materials may comprise any of polyolefin, polycarbonate, polyester, epoxy, fluoropolymer, derivatives thereof and combinations thereof. The inorganic dielectric materials may comprise any of arsenic trisulfide, arsenic selenide, α-alumina (sapphire), magnesium fluoride, calcium fluoride, diamond, derivatives thereof and combinations thereof.

In some embodiments, the dielectric layer contains a dielectric material with a refractive index within a range from about 1 to about 3. In an embodiment, the dielectric layer can be physically or optically textured. The physical and/or optical texture may be provided by embedding particles within the dielectric material. In this embodiment, the dielectric material comprises particles such as alumina, titania, silica or combinations thereof, to scatter light, disposed on a p-n structure.

In an embodiment, the dielectric layer contains a dielectric material whose coefficient of thermal expansion (CTE) is similar to that of the Group III-V semiconductor onto which it is disposed. In another embodiment, the CTE of the dielectric materials in the dielectric layer are dissimilar from that of the Group III-V semiconductor onto which they are disposed.

In another embodiment, the dielectric layer comprises a textured surface to scatter light and improve adhesion to both metal and semiconductor layers. Texturing of the dielectric surface can be achieved by particle or other mask deposition followed by etching, particle blasting, mechanical imprinting such as imprint lithography or stamping, laser ablation, wet etching or dry etching.

In another embodiment, the dielectric layer comprises a surface diffraction grating to disperse light. The pitch and facet profile of the surface diffraction grating is chosen such that at the band gap wavelength: 1. Zeroth order diffraction is minimized and 2. First order diffraction angle is higher than the angle of total internal reflection. The diffraction grating with increased angle allows more light to be diffracted into the optoelectronic device. Grating of the dielectric surface may be accomplished by mechanical imprinting such as but not limited to imprint lithography, imprint stamping or laser ablation. Alternatively, other techniques such as photolithography, electron-beam lithography, interference lithography, etc. may be used.

Adhesion between the p-n structure and the dielectric material can be improved by texturing the p-n structure or the dielectric layer as described above, or chemically, for example with alkylphosphonate monolayers or derivatives thereof. The adhesion layer may have a thickness within a range from about a monolayer to about 100 Å. The dielectric adhesion layer may be deposited by a variety of techniques including, but not limited to, atomic layer deposition (ALD), spincoating, inkjetting, chemical bath deposition (CBD) or dipcoating techniques.

Referring again back to FIG. 1, a metallic layer is then disposed on the dielectric layer. In some embodiments, in which the dielectric layer has been provided with openings via step 106, the metallic layer makes one or more contacts with the p-n structure through these openings.

The metallic layer may contain at least one metal, such as silver, gold, aluminum, nickel, copper, platinum, palladium, molybdenum, tungsten, titanium, chromium, alloys thereof, derivatives thereof, and combinations thereof. In specific examples, the metallic layer may contain silver, copper, or gold. The metallic layer may have a thickness within a range from about 1 nm to about 10,000 nm, preferably, from about 10 nm to about 4000 nm.

In an embodiment, the metallic layer may comprise one or more layers made of the same or different metals. For example, the metallic layer may comprise an adhesion layer comprising materials such as but not limited to nickel, molybdenum, tungsten, titanium, chromium, palladium, alloys thereof, derivatives thereof, or combinations thereof with a thickness less than 100 nm, and preferably less than 20 nm, along with a reflector layer comprising materials such as but not limited to silver, gold, aluminum, copper, platinum, alloys thereof, derivatives thereof, or combinations thereof with a thickness more than 50 nm.

Additional metallic layers may be also deposited, for example to improve the electrical or mechanical properties of the combination of metal layers, and may comprise a back metal with varying thickness. In another embodiment, metallic contacts may be formed separately from the metallic layer. For example, the metal in the apertures in the dielectric may be deposited prior to the dielectric deposition or prior to the metal reflector.

In an embodiment, the metallic layer comprises a metallic reflector layer disposed on or over the dielectric layer, and a plurality of reflector protrusions formed within the dielectric layer extending from the metallic reflector layer and into the p-n structure. In an embodiment, the metallic reflector layer may be textured. The metallic reflector layer thus formed may be on the back side of the optoelectronic device. For example, if the optoelectronic device is a photovoltaic device, the metallic reflector may be on the side of the device away from incident light.

The metallic reflector may contain at least one metal, such as silver, gold, aluminum, nickel, copper, platinum, palladium, alloys thereof, derivatives thereof, and combinations thereof. In specific examples, the metallic reflector layer may contain silver, copper, aluminum, platinum, or gold, alloys thereof, derivatives thereof, or combinations thereof. The metallic reflector layer may have a thickness within a range from about 1 nm to about 10,000 nm or greater. In some examples, the thickness of the metallic reflector layer may be from about 10 nm to about 4000 nm.

Similarly, the reflector protrusions contain at least one metal, such as silver, gold, aluminum, nickel, copper, platinum, palladium, molybdenum, tungsten, titanium, chromium, alloys thereof, derivatives thereof, and combinations thereof. In specific examples, the reflector protrusions may contain silver, copper, or gold. Each protrusion may have a diameter within a range from about 5 μm to about 100 μm, and preferably from about 50 μm to about 500 μm. Each protrusion may have a length within a range from about 10 nm to about 10 μm, such as from about 50 nm to about 1000 nm. In some embodiments, the reflector protrusion diameter or length may be defined by the vias in the dielectric, and the dielectric layer thickness, respectively.

In an embodiment, under the reflector protrusions there is an adhesion layer comprising materials such as but not limited to nickel, molybdenum, tungsten, titanium, chromium, palladium, alloys thereof, derivatives thereof, or combinations thereof. The adhesion layer may have a thickness within a range from about 1 Å to about 100 nm. The metallic adhesion layer may be deposited by a variety of techniques including, but not limited to, PVD (including evaporation and sputtering for example), electroless plating, electroplating, ALD, or CVD techniques.

In an embodiment, above the metallic layer are additional layers such as an adhesive, epoxy, or glue layer and above that layer there is a carrier layer such as a plastic. This can act as a handle material to hold the p-n structure, dielectric layer, and metal layer after a lift off step such as epitaxial liftoff (ELO). The mechanical properties of the adhesive and carrier layers may also affect the liftoff process itself, for example by affecting the overall stiffness of the combined handle, adhesive, p-n structure, dielectric layer, and metal layer structure during the liftoff. The carrier layer may also be flexible.

Referring back to FIG. 1, the p-n structure, the dielectric layer and the metal layer are then lifted off the substrate, via step 108. In some embodiments, a thin film optoelectronic device is subsequently removed from a support substrate or wafer, for example during an epitaxial lift off (ELO) process, a laser lift off (LLO) process, ion implantation and liftoff, liftoff by etching of a buried oxide layer or a buried porous layer, or a spalling process etc., where the thin film optoelectronic device compromises the p-n structure, the patterned dielectric layer, and the metal layer. The thin film optoelectronic devices thus formed may be flexible, single crystal devices.

In an embodiment, the optoelectronic device can include a plurality of non-continuous metal contacts that improve the reflectivity and reduce the power losses associated with the configuration of the back surface of the device. By reducing the amount of metal in direct contact with the semiconductor, plasmonic losses at the back contact are reduced, improving the angle-averaged reflectivity of the back contact, which in turn increases the minority carrier density in the device under illumination, improving the external fluorescence of the device and reducing the loss of recycled band edge photons within the device. These features are of particular importance in a photovoltaic cell and for light-emitting diode (LED) applications. For example, in a photovoltaic cell, a dielectric reflector may increase the open-circuit and operating voltage of the device. Accordingly, described below in conjunction with the accompanying figures are multiple embodiments of an optoelectronic device which utilizes such contacts.

By "non-continuous" metal contacts it is not necessarily implied that the metal contacts are disconnected. The metal contacts could be all connected together, or they could be disconnected. The metal contacts may be disconnected in this sense if for example there is an array of separate of contacts between the metal and the p-n structure. The metal contacts may be connected in this sense if for example there is a connected "finger" pattern where the metal connects to the p-n structure, such that metal does not contact the entirety of the p-n structure surface. The metal may also be connected to each other through the metallic layer itself. The front metal contacts may be non-continuous yet connected, in that they do not cover the entire front surface of the device (which would block the incident sunlight in the case of a photovoltaic cell, or the exiting light in the case of an LED), and yet are connected such that power can be input or extracted by making contact to a single point on the top metal of the device (in addition to making connection to the back of the device).

The non-continuous metal contacts in any of the above mentioned embodiments can be arranged such that there is no alignment (in the sense of an imaginary perpendicular line drawn directly through the device) between the contacts on the top of the device and the plurality of non-continuous metal contacts directly adjacent to the p-n structure material on the back of the device. Alternatively, there may be some area of alignment, but reduced relative to the total area of the front metal. In some embodiments, there may still be alignment between the front metal and the back mirror or the reflective metal, but there may be a dielectric between them. In other embodiments, there is no back mirror metal. In either case, this can provide an additional advantage in that the chance of a metal-on-metal short, either during device fabrication or after the device has aged, can be greatly reduced. This can improve manufacturing yield and product reliability. In other embodiments, the degree of alignment between back metal and front metal is substantially unchanged.

Finally, it is well understood by those of ordinary skill in the art that additional layers could exist either on top of the structures shown, or underneath them. For example, underneath the reflector metal there could be other support layers such as metals, polymers, glasses, or any combination thereof.

Figure 2C:
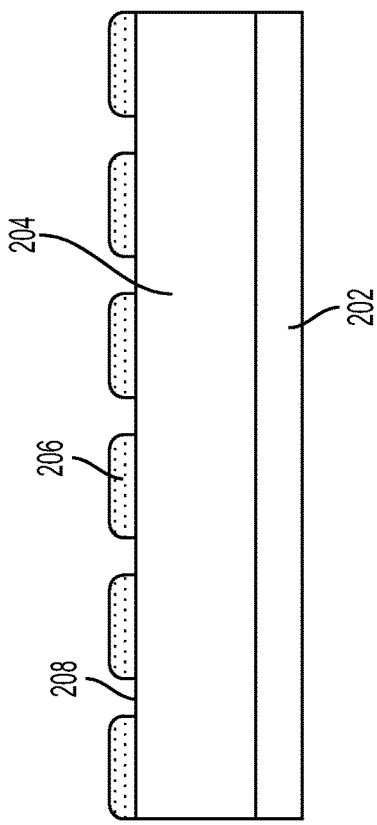
FIGS. 2a-e depict different stages of fabrication of an optoelectronic device comprising a dielectric layer according to an embodiment of the invention.
Figure 2D:
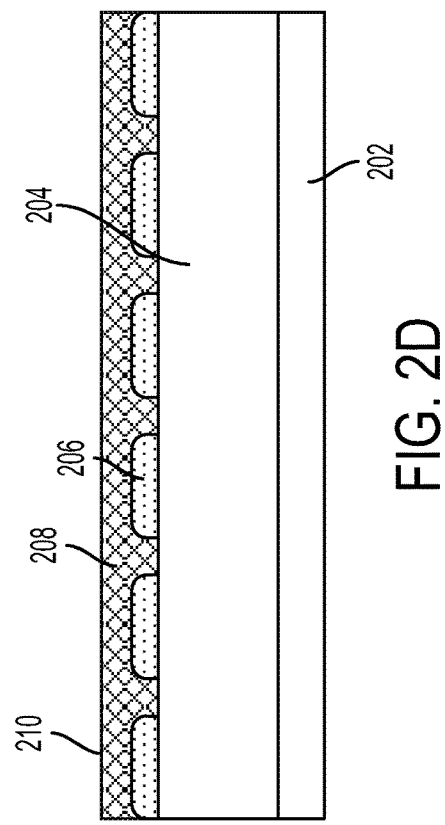
Figure 2A:
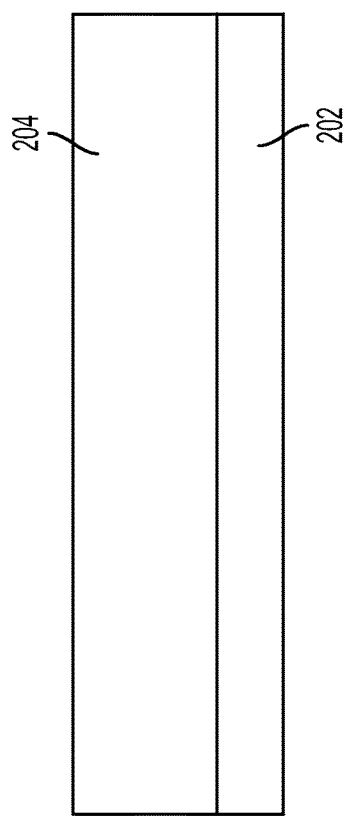
Figure 2B:
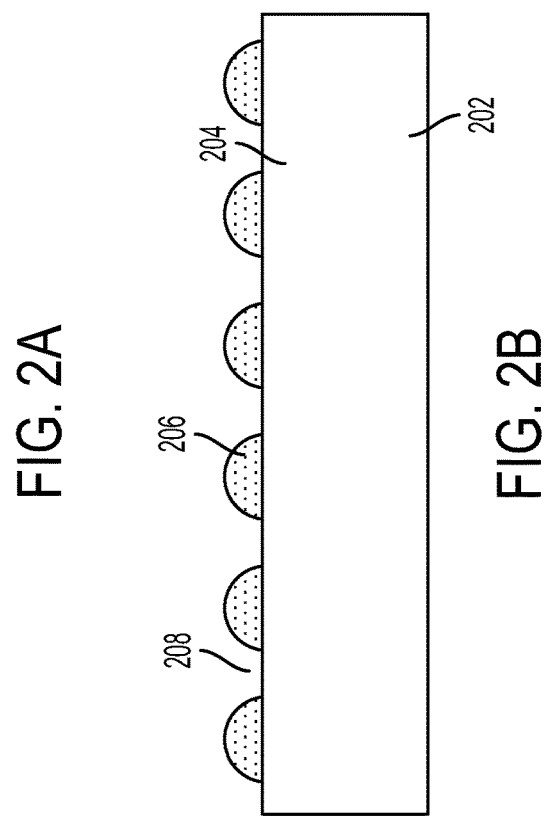
Figure 2E:
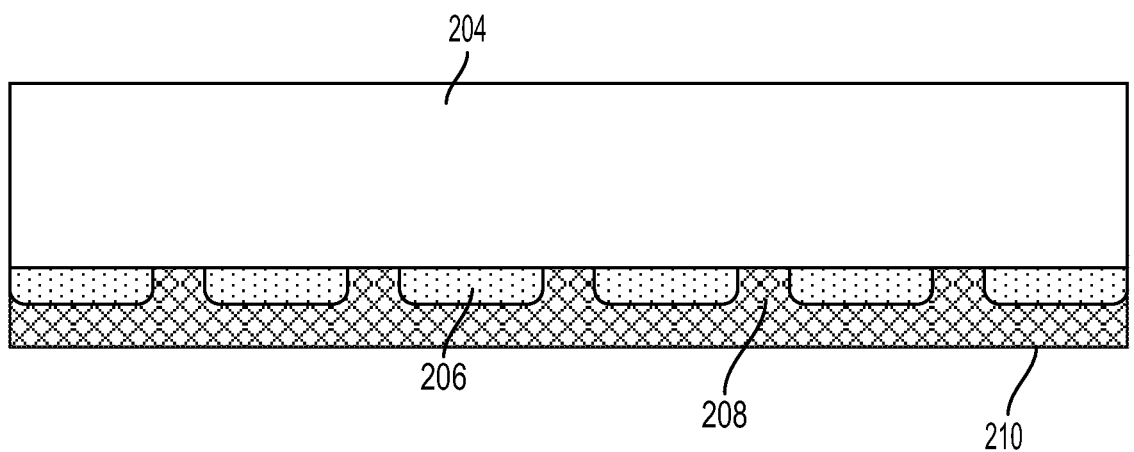

FIGS. 2a-e depict different stages of fabrication of an optoelectronic device comprising a dielectric layer according to an embodiment of the invention in which the dielectric is patterned directly, for example using an inkjet printing technique. As shown in FIG. 2a, a p-n structure 204 is disposed on a substrate 202. A dielectric layer 206 is then disposed in a pattern on the p-n structure 204 as shown in FIG. 2b, for example using inkjet printing. The dielectric layer 206 is then optionally cured, for example using heat, light, and/or time. After curing there are openings 208 through the dielectric layer 206 as shown in FIG. 2c. The size and shape of the dielectric 206 and the openings 208 may or may not change between patterned deposition and optional curing. A metallic layer 210 in then disposed on top of the dielectric layer 206 with metal protrusions forming through openings 208 as shown in FIG. 2d. The optoelectronic device thus formed is then lifted off the substrate using a lift off technique, for example, ELO. For example, in case of a photovoltaic device, once the device is lifted off, the metallic layer is on the back side of the device, away from the light facing side, as illustrated in FIG. 2e, and the metallic layer as well as the metallic protrusions enhance the efficiency of the device by scattering the light passing through the device within the device.

In an embodiment, the dielectric layer 206 comprises inkjet droplets. The inkjet droplets may wet the surface immediately on contact, at a wetting angle determined by the surface preparation and the associated surface energy. The droplets 206 may start spreading immediately and stop spreading once curing is complete and all the solvent has been driven out of the ink. The pitch may be unchanged during the cure but the droplet height may be reduced and droplet width may be increased. Defining the via size is a matter of controlling droplet volume, spreading rate (surface condition) and cure rate. In other embodiments involving direct patterning the droplets may be substantially unchanged between the deposition of the dielectric and any curing step.

In an embodiment, the optoelectronic device comprises a dielectric layer wherein the dielectric layer is patterned indirectly by using techniques such as etching or dissolving. For example, a p-n structure 204 is disposed on a substrate 202. A dielectric layer is then disposed on the p-n structure 204. The dielectric layer is then etched or dissolved to provide openings through the dielectric layer. A metallic layer is then disposed on top of the dielectric layer with metal protrusions forming through openings.

Figure 3A:
FIGS. 3a-f depict different stages of fabrication of an optoelectronic device comprising a dielectric layer according to another embodiment of the invention.
Figure 3B:
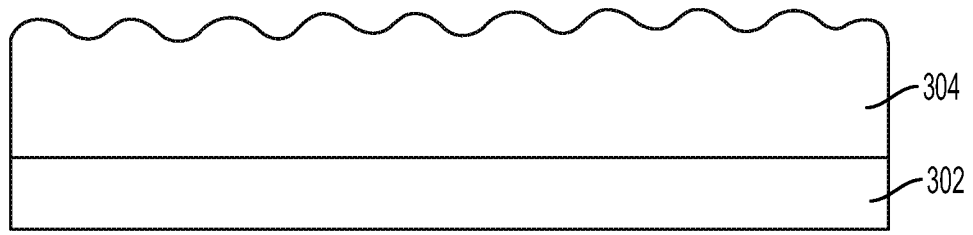
Figure 3C:
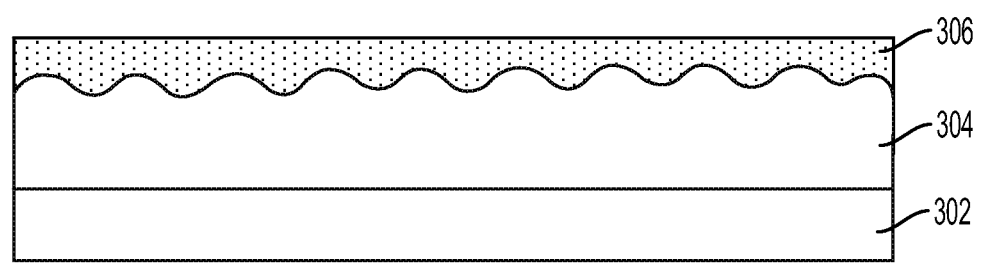
Figure 3D:
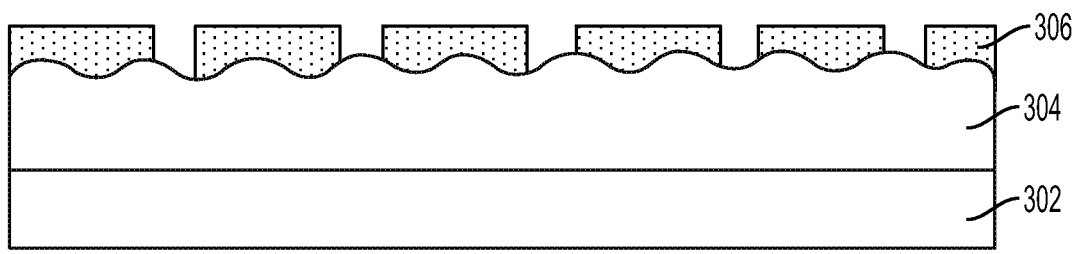
Figure 3E:
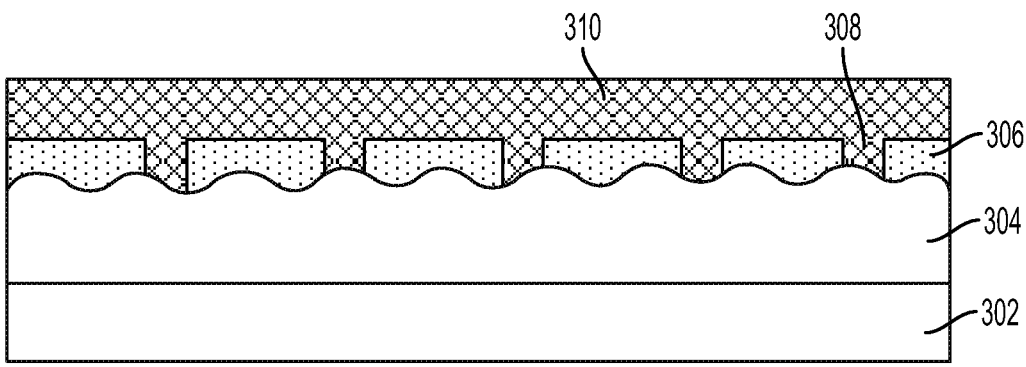
Figure 3F:
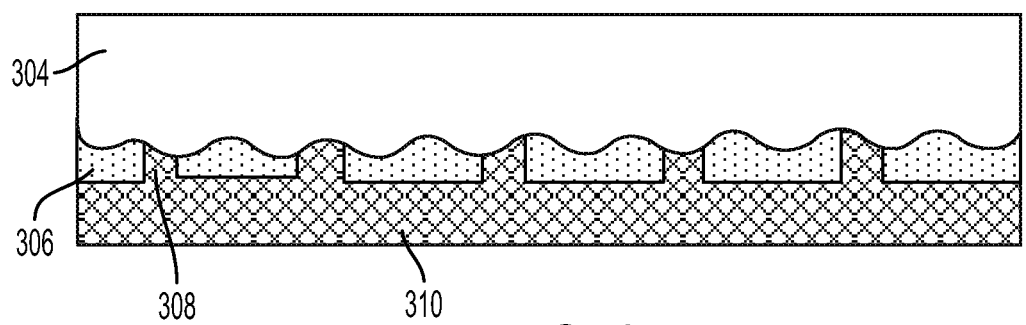

FIGS. 3a-f depict different stages of fabrication of an optoelectronic device comprising a p-n structure where the surface of the p-n structure is textured and a dielectric layer patterned using an indirect patterning technique, such as lithography, according to yet another embodiment of the invention. As shown in FIGS. 3a and 3b, a textured p-n structure 304 is disposed on a substrate 302. A dielectric layer 306 is then disposed on the p-n structure 304 as shown in FIG. 3c. The dielectric layer 306 is etched or dissolved to provide openings 308 through the dielectric layer 306 as shown in FIG. 3d. A metallic layer 310 in then disposed on top of the dielectric layer 306 with metal protrusions forming through openings 308 as shown in FIG. 3e. The optoelectronic device thus formed is then lifted off the substrate using a lift off technique, for example, ELO. For example, in case of a photovoltaic device, once the device is lifted off, the metallic layer is on the back side of the device, away from the light facing side, as illustrated in FIG. 3f, and the metallic layer as well as the metallic protrusions enhance the efficiency of the device by scattering the light passing through the device within the device.

In an embodiment, the optoelectronic device comprises a p-n structure where the surface of the p-n structure is textured and a dielectric layer patterned using a direct patterning technique, such as inkjet printing. As shown in FIGS. 3a and 3b, a textured p-n structure 304 is disposed on a substrate 302. A dielectric layer is then disposed in a pattern on the p-n structure 304. The dielectric layer is then optionally cured, for example using heat, light, and/or time. After curing there are openings through the dielectric layer. The size and shape of the dielectric and the openings may or may not change between patterned deposition and optional curing. A metallic layer in then disposed on top of the dielectric layer with metal protrusions forming through openings.

FIGS. 4 a-e depict exemplary embodiments of an optoelectronic device comprising a dielectric layer after it is separated from the substrate according to the present invention. FIGS. 4 a-e generally depict different embodiments comprising a p-n structure 404, a dielectric layer 406 and a metallic layer 410. As shown in FIGS. 4a and 4b, the surface of the p-n structure 404 can be smooth with patterned dielectric layer 406. As shown in FIGS. 4c, 4d and 4e, the surface of the p-n structure can be textured. The dielectric layer 406 may or may not conform to the surface texture of the p-n structure 404. FIGS. 4a, 4b and 4e illustrate the dielectric layer 406 conforming to the surface texture of the p-n structure 404. FIGS. 4c and 4d illustrate the dielectric layer 406 not conforming to the surface texture of the p-n structure 404. The dielectric layer 406 may be patterned indirectly as illustrated in FIGS. 4b, 4d and 4e by a subtractive process such as wet or dry etching, photolithography, electron-beam lithography, imprint lithography, or laser ablation, etc. Alternatively, the dielectric layer 406 may be patterned directly as illustrated in FIGS. 4a and 4c by an additive process such as inkjet printing, shadow masking, or screen printing, etc. The dielectric layer 406 may inherit the texture of the p-n structure, as shown in FIG. 4e. Alternatively, the dielectric layer may have a different texture from the p-n structure, for example, because of an additional texturing step, or because of a property of the dielectric. Alternatively the dielectric may be smooth, as shown in FIG. 4b. The metallic layer 410 may also be textured (not shown) or smooth.

The metal layer 410 may or may not conform to the structure of the dielectric layer 406. In a preferred embodiment, the surface of the p-n structure 404 is textured, with the dielectric layer 406 disposed on or over the p-n structure 404, where the dielectric layer 406 may not inherit the surface structure of the p-n structure 404, and a metal layer 410 disposed on or over the dielectric layer 406 with a texture conforming that of the dielectric layer 406. In an alternate embodiment, the dielectric layer 406 may inherit the surface structure of the p-n structure 404 and a metal layer 410 disposed on or over the dielectric layer 406 with a texture conforming to that of the dielectric layer 406 (not shown).

Figure 5:
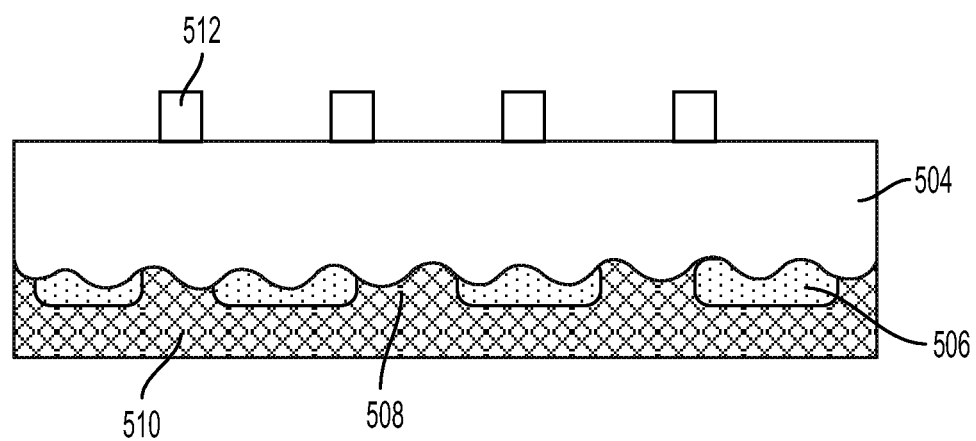
FIG. 5 illustrates an optoelectronic device with front metal contacts according to an embodiment of the invention.

FIG. 5 illustrates an optoelectronic device with front metal contacts after it is separated from the substrate according to an embodiment of the invention. As shown in FIG. 5, a dielectric layer 506 is disposed on a p-n structure 504. The dielectric layer 506 can be patterned either directly or indirectly, as described above, to provide openings 508 through the dielectric layer 506 as shown. A metallic layer 510 is then disposed on top of the dielectric layer 506 with metal protrusions forming through openings 508. The optoelectronic device is also provided with front metal contacts 512. In some embodiments, the front metal contacts 512 are arranged such that there is no alignment (in the sense of an imaginary perpendicular line drawn directly through the device) between the front metal contacts 512 on the top of the device and the plurality of non-continuous metal contacts directly adjacent to the p-n structure material on the back of the device as illustrated by metal protrusions formed through openings 508. In another embodiment, the front and back metal contacts may be aligned. Optionally, an antireflection coating (ARC) may be deposited on the optoelectronic device as well (not shown in the figures).

In an embodiment, the front and/or back metal contacts can be deposited on the optoelectronic device before or after the device is separated from the substrate. In another embodiment, additional layers can be deposited on the optoelectronic device before or after the device is separated from the substrate.

Although the present invention has been described in accordance with the embodiments shown, one of ordinary skill in the art will readily recognize that there could be variations to the embodiments and those variations would be within the spirit and scope of the present invention. For example, the metal contacts on either the front side and/or the back side of a device can be replaced by a highly conductive yet transparent or semi-transparent layer, for example a transparent conductive oxide and that would be within the spirit and scope of the present invention. Accordingly, many modifications may be made by one of ordinary skill in the art without departing from the spirit and scope of the appended claims.

What is claimed is:

1. A method for fabricating an optoelectronic device, the method comprising:
   providing a p-n structure on a substrate;
   patterning a dielectric layer on the p-n structure, the patterned dielectric layer is patterned to form a plurality of apertures, and each aperture extends through the patterned dielectric layer and to the p-n structure; and
   disposing a metal layer on the dielectric layer, the patterned dielectric layer provides adhesion to the p-n structure and the metal layer;
   wherein the metal layer as deposited makes electrical contact to the p-n structure at a plurality of locations, the metal layer including a plurality of metallic reflector protrusions each of which extends from the metal layer into a respective aperture from the plurality of apertures to fill the respective aperture, and the plurality of metallic reflector protrusions provide the plurality of locations at which the metal layer has electrical contact to the p-n structure; and
   then lifting the optoelectronic device off the substrate, such that after the lift off the p-n structure is closer than the patterned dielectric layer to a front side of the optoelectronic device which is to face incident light, wherein the optoelectronic device comprises the p-n structure, the patterned dielectric layer, and the metal layer.

2. The method of claim 1, wherein the p-n structure comprises a Group III-V semiconductor layer.

3. The method of claim 1, wherein the p-n structure comprises a physically textured surface.

4. The method of claim 1, further comprising:
disposing, after the lifting of the optoelectronic device off the substrate, metallic contacts to the front side of the optoelectronic device, positioned such that the metallic contacts to the front side of the optoelectronic device and the plurality of locations at which the metal layer makes contact to the p-n structure are offset to prevent short circuits.

5. The method of claim 1, wherein the patterned dielectric layer comprises dielectric materials that are resistant to etching by hydrochloric acid, sulfuric acid, or hydrofluoric acid during an epitaxial lift off (ELO) process for the lifting the optoelectronic device off the substrate.

6. The method of claim 5, wherein the dielectric materials are organic materials comprising any of polyolefin, polycarbonate, polyester, epoxy, fluoropolymer, derivatives thereof and combinations thereof.

7. The method of claim 5, wherein the dielectric materials are inorganic comprising any of arsenic trisulfide, arsenic selenide, a-alumina (sapphire), magnesium fluoride, derivatives thereof and combinations thereof.

8. The method of claim 1, wherein the dielectric layer is provided for patterning by using any of spin coating, dip coating, spray coating, physical vapor deposition (PVD), plasma enhanced chemical vapor deposition (PECVD), atomic layer deposition (ALD), powder coating, sol gel, ion-beam assisted chemical vapor deposition (IBRD CVD), chemical bath deposition, inkjet printing, screen printing and lamination.

9. The method of claim 1, wherein the patterning of the dielectric layer is done by using any of wet etching, dry etching, disposing the dielectric layer using inkjet printing, photolithography, shadow masking, imprint lithography, laser ablation and screen printing.

10. The method of claim 1, further comprising optical texturing of the patterned dielectric layer.

11. The method of claim 10, wherein the optical texturing is accomplished by disposing particles from the group consisting of alumina, titania, silica, derivatives thereof and combinations thereof; wherein the particles are disposed any of between the p-n structure and the dielectric layer, within the dielectric layer, between the dielectric layer and the metal layer or a combination thereof.

12. The method of claim 1, further comprising physical texturing of a surface of the patterned dielectric layer.

13. The optoelectronic device of claim 12, wherein the physical texturing of the surface of the patterned dielectric layer is achieved by any of etching, exposure to a plasma, particle blasting, mechanical imprinting, laser ablation, and a combination thereof, and wherein when the etching is used the etching is a wet etch or a dry etch.

14. The method of claim 1, wherein the metal layer further comprises a metallic reflector layer from which the metallic reflector protrusions extend.

15. The method of claim 14, wherein the metallic reflector layer comprises a metal selected from the group consisting of silver, gold, aluminum, nickel, copper, platinum, palladium, molybdenum, tungsten, titanium, chromium, alloys thereof, derivatives thereof, and combinations thereof.

16. The method of claim 1, wherein the metallic reflector protrusions comprise a metal selected from the group consisting of silver, gold, aluminum, nickel, copper, platinum, palladium, molybdenum, tungsten, titanium, chromium, alloys thereof, derivatives thereof, and combinations thereof.

17. The method of claim 1, wherein the p-n structure comprises multiple p-n junctions.

* * * * *